United States Patent
Ho et al.

(10) Patent No.: US 8,395,139 B1
(45) Date of Patent: Mar. 12, 2013

(54) 1T1R RESISTIVE MEMORY DEVICE AND FABRICATION METHOD THEREOF

(75) Inventors: Hsin-Jung Ho, New Taipei (TW); Chang-Rong Wu, New Taipei (TW); Wei-Chia Chen, Taoyuan County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 0 days.

(21) Appl. No.: 13/311,576

(22) Filed: Dec. 6, 2011

(51) Int. Cl.
  *H01L 47/00* (2006.01)
(52) U.S. Cl. .............. 257/4; 257/331; 257/E29.262; 257/E21.41; 257/E47.001; 438/270
(58) Field of Classification Search .............. 257/4, 331, 257/E29.262, E21.41, E47.001; 438/270
  See application file for complete search history.

(56) References Cited

U.S. PATENT DOCUMENTS

| | | | |
|---|---|---|---|
| 7,324,372 B2 * | 1/2008 | Hanzawa et al. ............. 365/173 |
| 7,359,226 B2 * | 4/2008 | Schwerin ..................... 365/49.1 |
| 7,420,202 B2 * | 9/2008 | Adams et al. ................... 257/18 |
| 7,436,698 B2 * | 10/2008 | Lin et al. ...................... 365/158 |
| 7,964,914 B2 * | 6/2011 | Jung ............................. 257/331 |
| 8,034,655 B2 * | 10/2011 | Smythe et al. ................ 438/104 |
| 8,138,538 B2 * | 3/2012 | Moll et al. ..................... 257/302 |
| 2005/0201182 A1 * | 9/2005 | Osada et al. ............. 365/230.03 |
| 2006/0113587 A1 * | 6/2006 | Thies et al. .................... 257/328 |
| 2008/0185571 A1 * | 8/2008 | Happ et al. ......................... 257/4 |
| 2008/0316805 A1 * | 12/2008 | Lambert et al. ............... 365/163 |
| 2009/0127586 A1 * | 5/2009 | Gruening-von Schwerin ....................... 257/205 |
| 2009/0236658 A1 * | 9/2009 | Gruening-Von Schwerin ....................... 257/331 |
| 2012/0039104 A1 * | 2/2012 | Lin et al. .......................... 365/63 |
| 2012/0119286 A1 * | 5/2012 | Kim et al. ...................... 257/329 |
| 2012/0145985 A1 * | 6/2012 | Lee .................................... 257/4 |
| 2012/0241826 A1 * | 9/2012 | Satoh et al. .................... 257/295 |

* cited by examiner

*Primary Examiner* — N Drew Richards
*Assistant Examiner* — Ankush Singal
(74) *Attorney, Agent, or Firm* — Winston Hsu; Scott Margo

(57) ABSTRACT

A memory structure includes an active area surrounded by first isolation trenches and second isolation trenches; a bit line trench recessed into the active area of the semiconductor substrate; a word line trench recessed into the active area of the semiconductor substrate and being shallower than the bit line trench. The bit line trench and the word line trench together divide the active area into four pillar-shaped sub-regions. A bit line is embedded in the bit line trench. A word line is embedded in the word line trench. A vertical transistor is built in each of the pillar-shaped sub-regions. A resistive memory element is electrically coupled to the vertical transistor.

11 Claims, 8 Drawing Sheets ns, and a resistive memory element electrically coupled to the vertical transistor.

These and other objectives of the present invention will no doubt become obvious to those of ordinary skill in the art after reading the following detailed description of the preferred embodiment that is illustrated in the various figures and drawings.

1T1R RESISTIVE MEMORY DEVICE AND FABRICATION METHOD THEREOF

BACKGROUND OF THE INVENTION

1. Field of the Invention

The present invention relates generally to the filed of semiconductor memory and, more particularly, to a 1-transistor, 1-resistor (1T1R) resistive memory device with vertical transistors and buried bit lines, and fabrication method thereof.

2. Description of the Prior Art

Current Flash and DRAM technologies are believed to scale down to 18 nm and face scaling limitations beyond 18 nm. Therefore, a variety of new memory schemes have been investigated. One of the most promising schemes is the resistive switching RAM or RRAM, which is operated based on the electronic (current or voltage induced) switching of a resistor element material between two stable resistive states.

One known form of a RRAM device has memory cells each built on a pillar diode structure. However, the equivalent circuit of each memory cell includes a tunnel gate surface effect transistor having non-uniform gate oxide built on the pillar diode structure. Thus, the pillar diode does not function as a diode in the forward conducting direction.

Another form of a resistive memory array utilizes FET access, which can be operated at relatively lower voltages and lower leakages. The resistive memory array utilizing the FET access also has better current control compared to the diode access RRAM. However, the fabrication process of such FET access RRAM is complex.

It is desirable to provide an improved resistive memory device with better scalability and an improved method for fabricating such device which is less complex than the prior art.

SUMMARY OF THE INVENTION

It is one object of this invention to provide an improved 1T1R resistive memory cell for semiconductor devices, which may occupy an area of 4F2 (where F is a minimum feature size of a technology) to provide reduced area and higher memory cell packing density.

It is another object of this invention to provide a method for fabricating a 1T1R resistive memory cell with a vertical transistor built in a silicon pillar and a buried bit line embedded next to the silicon pillar.

It is another object of this invention to provide a method for fabricating a 1T1R resistive memory cell, which incorporates a self-aligned memory process and is thus less complex than the prior art.

In accordance with one embodiment of this invention, a memory structure includes an active area of a semiconductor substrate, surrounded by first isolation trenches extending along a first direction and second isolation trenches extending along a second direction; a bit line trench recessed into the active area of the semiconductor substrate, wherein the bit line trench extends along the second direction and intersect the first isolation trenches; a word line trench recessed into the active area of the semiconductor substrate and being shallower than the bit line trench, wherein the word line trench extends along the first direction and intersect the second isolation trenches, and wherein the bit line trench and the word line trench together divide the active area into four pillar-shaped sub-regions; a bit line embedded in the bit line trench; a word line embedded in the word line trench; a vertical transistor built in each of the pillar-shaped sub-regions; and a resistive memory element electrically coupled to the vertical transistor.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings:

FIGS. 1-7 demonstrate an exemplary method for fabricating a 1T1R resistive memory cell in accordance with one embodiment of this invention, wherein FIGS. 1A-7A are top views that demonstrate a portion of the memory array, FIGS. 1B-7B, and 1C-7C are cross-sectional views taken along line I-I' and II-II' of FIGS. 1A-7A, respectively.

Figure 1C:
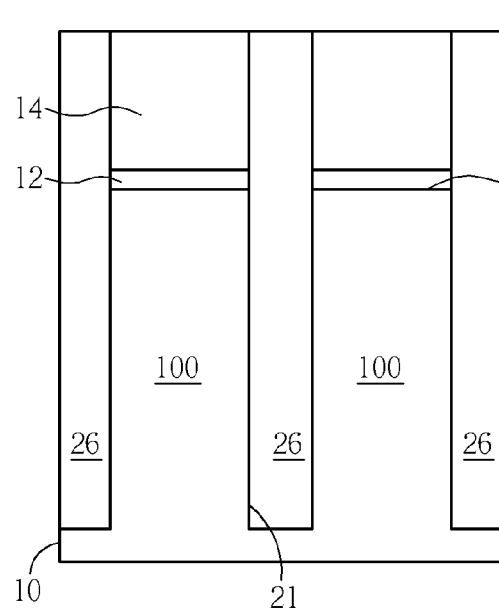

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description, reference is made to the accompanying drawings, which form a part hereof, and in which is shown by way of illustration specific examples in which the embodiments may be practiced. These embodiments are described in sufficient detail to enable those skilled in the art to practice them, and it is to be understood that other embodiments may be utilized and that structural, logical and electrical changes may be made without departing from the described embodiments. The following detailed description is, therefore, not to be taken in a limiting sense, and the included embodiments are defined by the appended claims.

With regard to the fabrication of transistors and integrated circuits, the term "major surface" refers to that surface of the semiconductor layer in and about which a plurality of transistors are fabricated, e.g., in a planar process. As used herein, the term "vertical" means substantially orthogonal with respect to the major surface. Typically, the major surface is along a <100> plane of a monocrystalline silicon layer on which the field-effect transistor devices are fabricated.

The present invention pertains to an improved 1T1R resistive memory cell for semiconductor devices, which may occupy an area of 4F2 (where F is a minimum feature size of a technology) to provide reduced area and higher memory cell packing density. The 1T1R resistive memory cell has a vertical transistor built in a vertical silicon pillar and a buried bit line embedded snugly next to the silicon pillar. An exemplary method for fabricating such 1T1R resistive memory cell incorporating a self-aligned memory process is also disclosed.

FIGS. 1-7 demonstrate an exemplary method for fabricating a 1T1R resistive memory cell in accordance with one embodiment of this invention, wherein FIGS. 1A-7A are top views that demonstrate a portion of the memory array, FIGS.

1B-7B, and 1C-7C are cross-sectional views taken along line I-I' and II-II' of FIGS. 1A-7A, respectively.

Figure 1A:
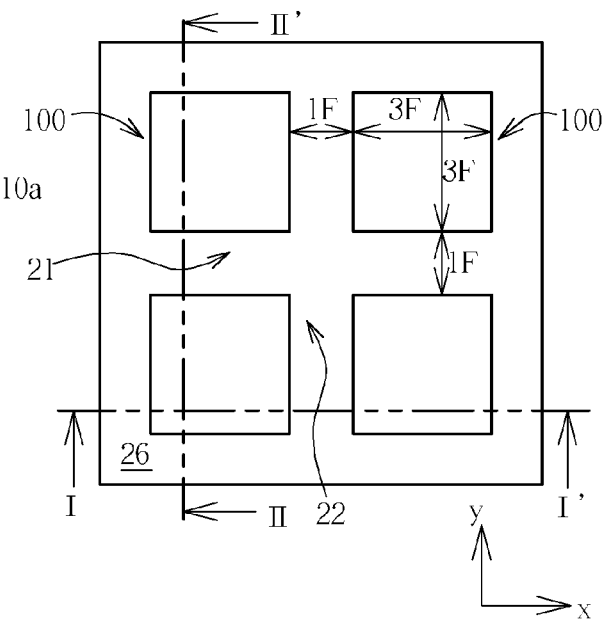
Figure 1B:
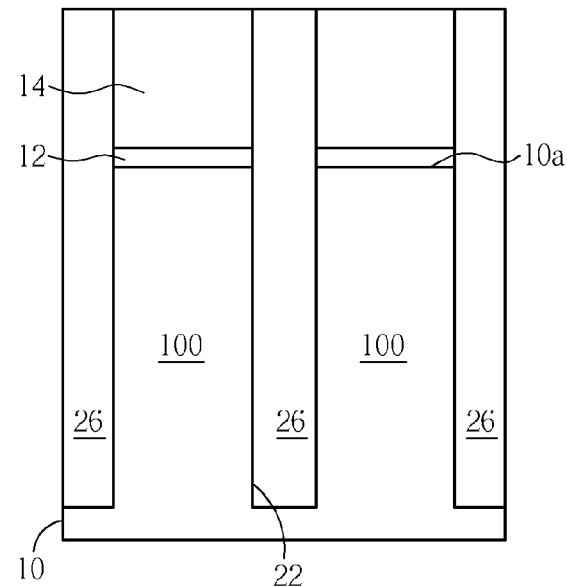

As shown in FIGS. 1A-1C, a semiconductor substrate 10 such as a silicon substrate is provided. A pad oxide layer 12 and a pad nitride layer 14 may be formed on a major surface 10a of the semiconductor substrate 10. Subsequently, at last a first isolation trench 21 and at least a second isolation trench 22 that is normal to the first isolation trench 21 are etched into the semiconductor substrate 10. The first isolation trench 21 extends along the reference x-axis and the second isolation trench 22 extends along the reference y-axis. According to the embodiment, each of the first isolation trench 21 and the second isolation trench 22 has a width that is equal to 1F. The first isolation trench 21 and the second isolation trench 22 together define an array of active areas 100 each has a side dimension that is equal to 3F.

After the formation of the active areas 100, a trench fill layer 26 such as silicon oxide is deposited to fill the first isolation trench 21 and the second isolation trench 22. A chemical mechanical polish (CMP) process may be carried out to planarize the trench fill layer 26. After the CMP process, a top surface of the trench fill layer 26 is substantially flush with a top surface of the pad nitride layer 14.

Figure 2C:
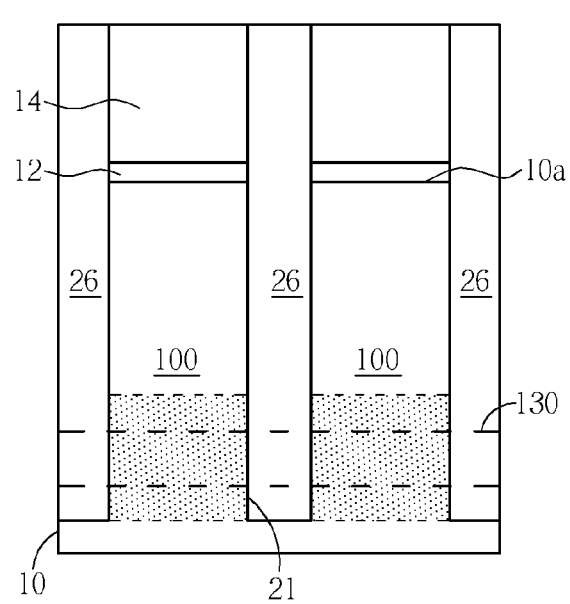
Figure 2A:
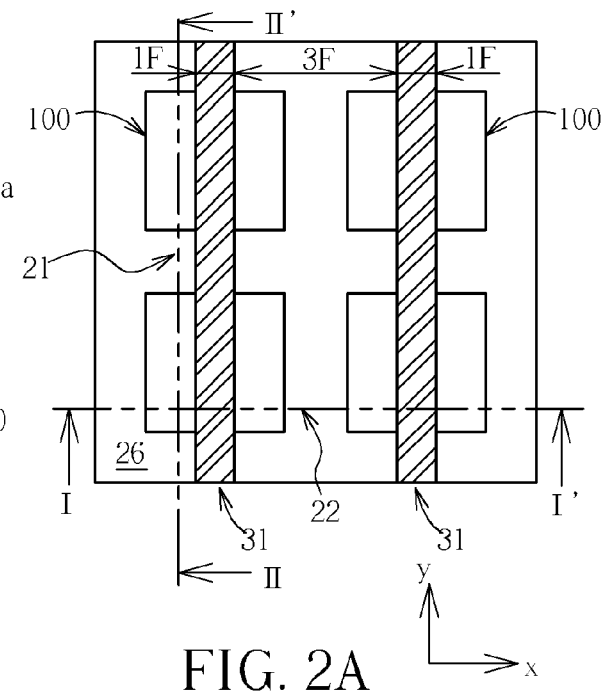
Figure 2B:
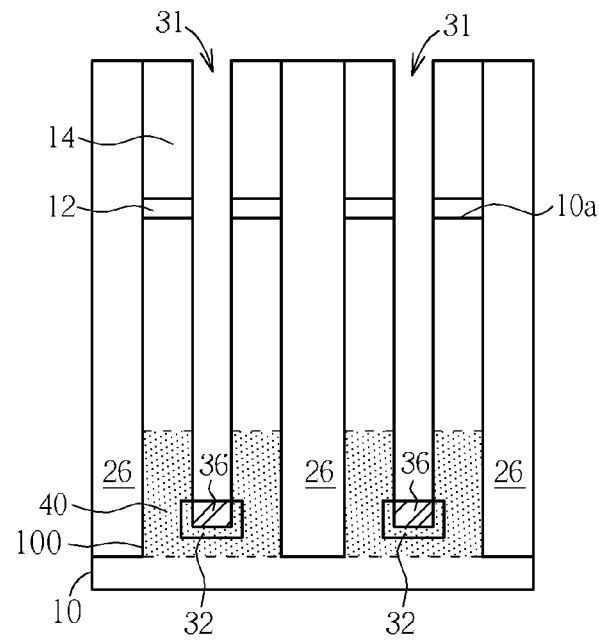

As show in FIGS. 2A-2C, a plurality of bit line trenches 31 are etched into the semiconductor substrate 10. Each of the bit line trenches 31 extends along the reference y-axis between two parallel second isolation trenches 22. According to the embodiment, each of the bit line trenches 31 has a width that is equal to 1F (half-pitch=2F). The bit line trenches 31 intersect the active areas 100 and the first isolation trench 21. To form the bit line trenches 31, a lithographic process and a dry etching process are carried out to etch the pad nitride layer 14, the pad oxide layer 12, the trench fill layer 26 and the semiconductor substrate 10.

Subsequently, a source doping region 40 is formed at a lower portion of each of the active areas 100. The source doping region 40 may be formed by using implantation with consequent annealing or gas phase diffusion (GPD) methods known in the art. A trench bottom doping region 32 is then formed at the bottom of each of the bit line trenches 31. A conductive layer or bit line 36 such as TiN is then formed on the trench bottom doping region 32. For example, to form the bit line 36, the bit line trenches 31 are filled with a TiN layer, planarized, and then the TiN layer is recessed. In FIG. 2C, the position of the bit line 36 is indicated by dashed line 130.

Figure 3C:
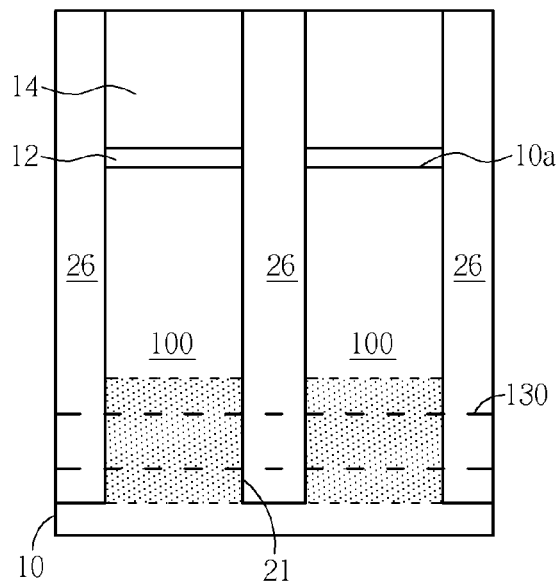
Figure 3A:
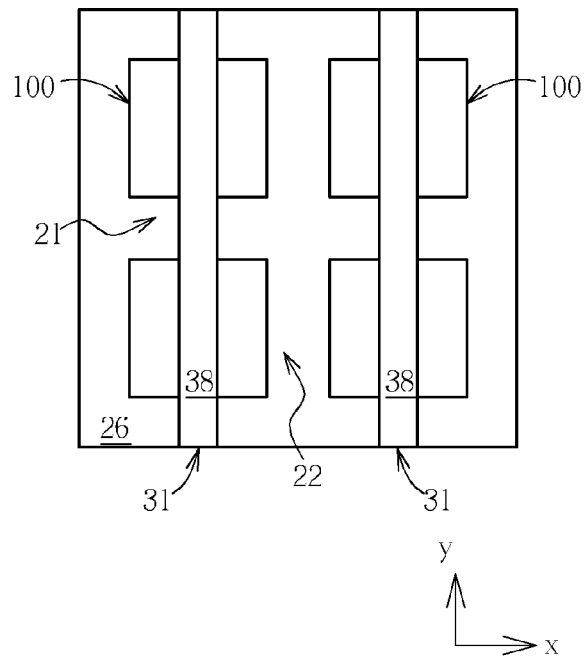
Figure 3B:
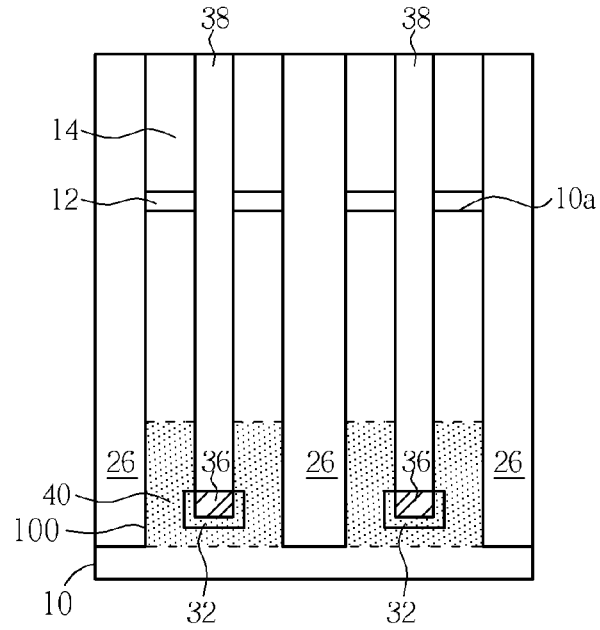

As shown in FIGS. 3A-3C, subsequently, a chemical vapor deposition (CVD) process may be carried out to deposit a bit line cap oxide layer 38 over the semiconductor substrate 100 in a blanket manner. The bit line cap oxide layer 38 fills up the bit line trenches 31. Thereafter, a CMP process is performed to planarize the bit line cap oxide layer 38 outside the bit line trenches 31. After the CMP process, the bit line cap oxide layer 38 is substantially flush with the silicon nitride layer 14. In FIG. 3C, the position of the bit line 36 is indicated by dashed line.

Figure 4C:
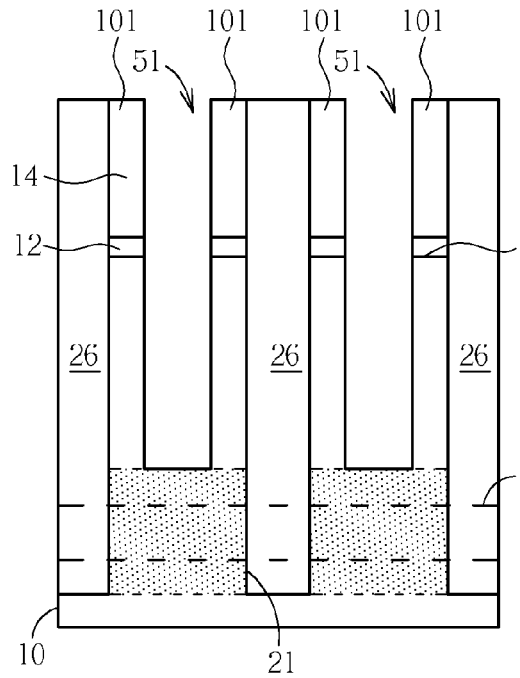
Figure 4A:
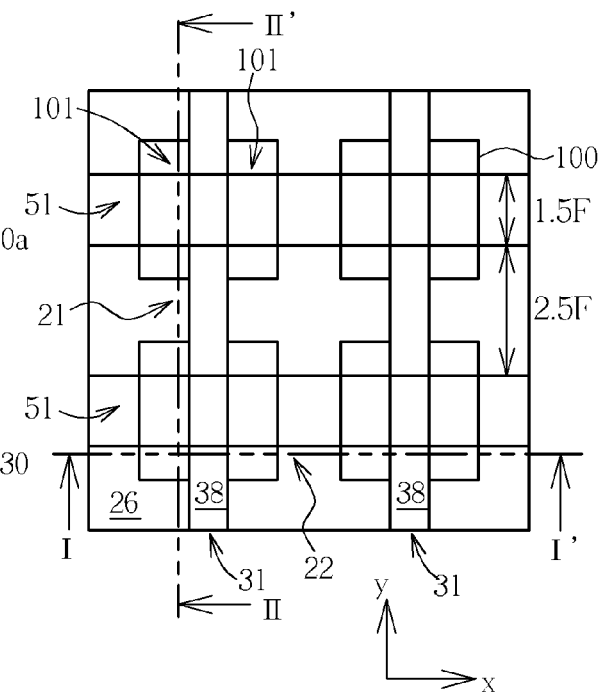
Figure 4B:
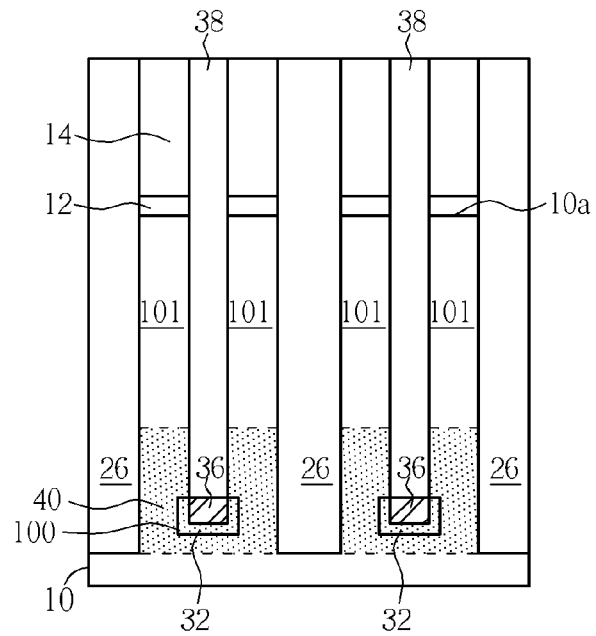

As shown in FIGS. 4A-4C, a lithographic process and a dry etching process are carried out to form a plurality of word line trenches 51, which are shallower than the bit line trenches 31. Each of the word line trenches 51 extends along the reference x-axis between two parallel first isolation trenches 21. According to the embodiment, each of the word line trenches 51 has a width that is equal to 1.5F (half-pitch=2F). The word line trenches 51 intersect the active areas 100, the bit line trenches 31 and the second isolation trench 22. The bit line trenches and the word line trenches 51 together divide each of the active area 100 into four pillar-shaped sub-regions 101.

Figure 5C:
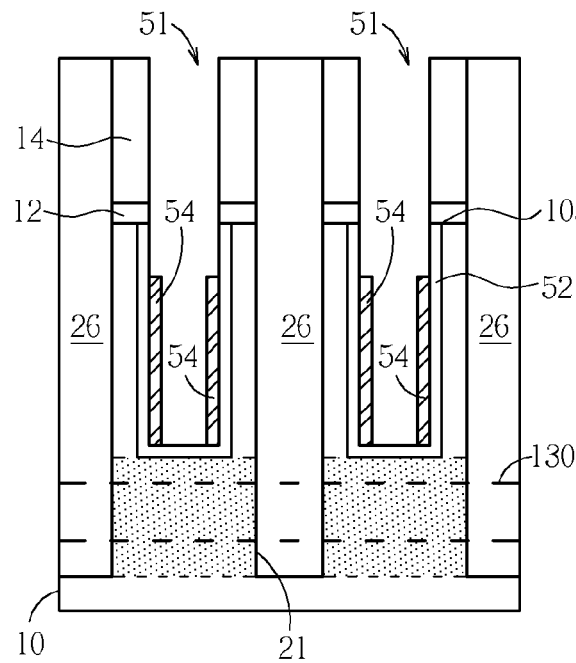
Figure 5A:
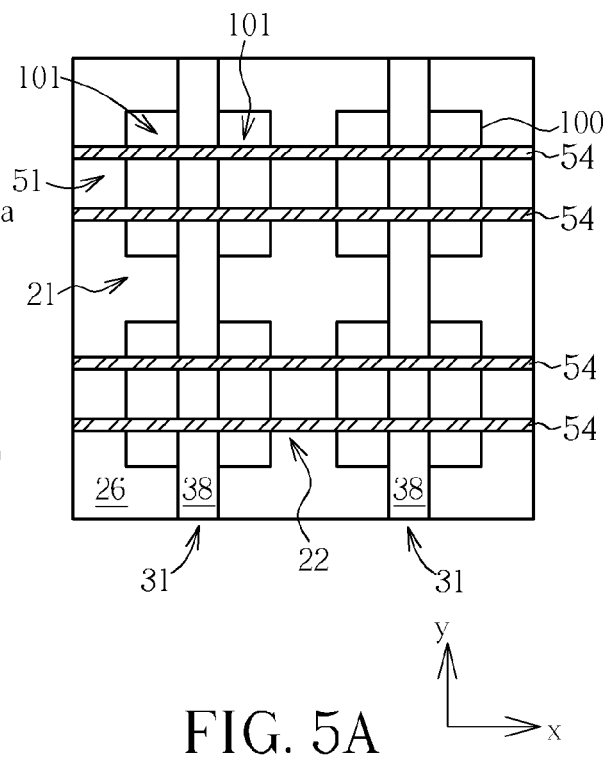
Figure 5B:
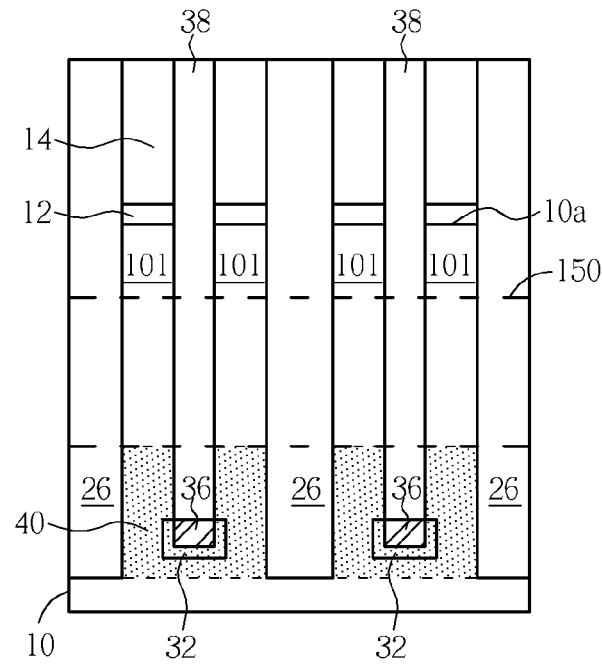

As shown in FIGS. 5A-5C, after the formation of the word line trenches 51, an oxidation process may be performed to form a gate oxide layer 52 on the interior surface of the word line trenches 51. Preferably, the oxidation process is carried out at relatively lower temperatures, for example, 500~600° C. A word line 54 such as TiN is then formed on each sidewall of the word line trenches 51. In FIG. 5B, the position of the word line 54 is indicated by dashed line 150.

Figure 6C:
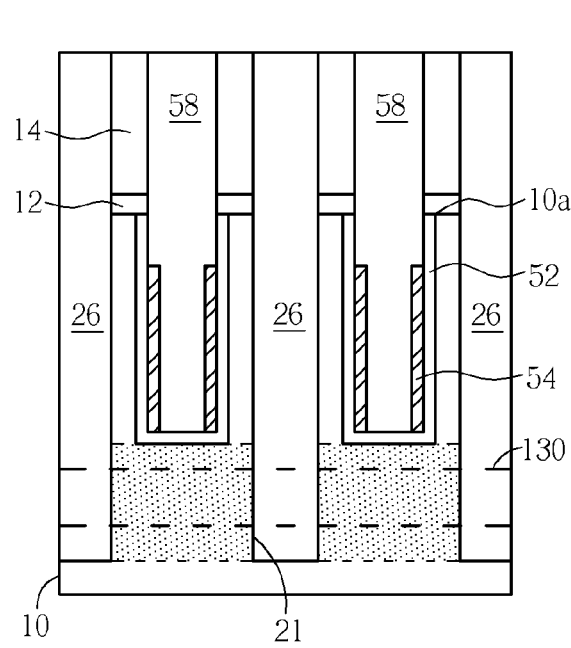
Figure 6A:
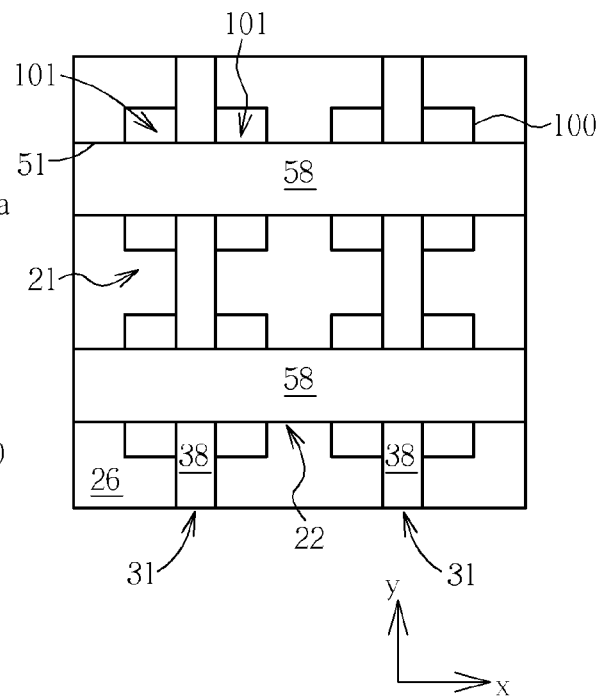
Figure 6B:
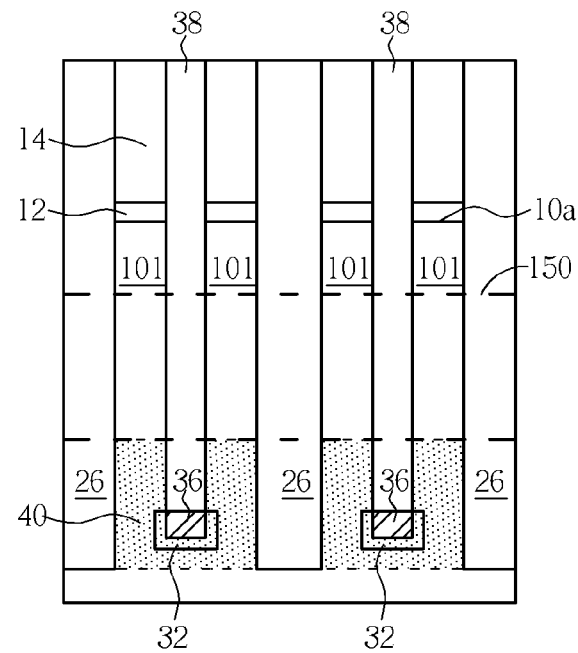

As shown in FIGS. 6A-6C, subsequently, a CVD process may be carried out to deposit a word line cap oxide layer 58 over the semiconductor substrate 100 in a blanket manner. The word line cap oxide layer 58 fills up the word line trenches 51. Thereafter, a CMP process is performed to planarize the word line cap oxide layer 58 outside the bit line trenches 51. After the CMP process, the word line cap oxide layer 58 is substantially flush with the silicon nitride layer 14.

Figure 7C:
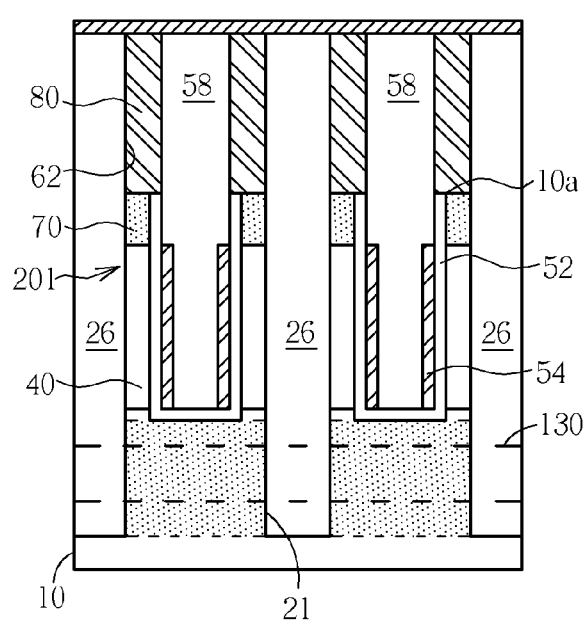
Figure 7A:
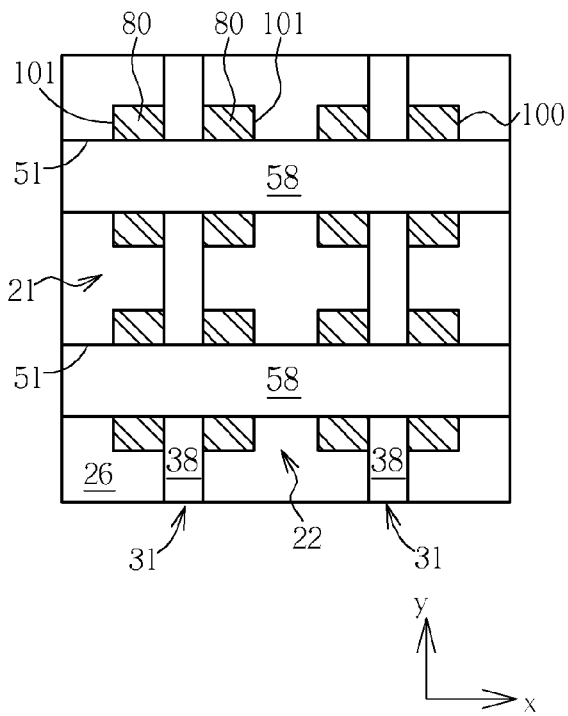
Figure 7B:
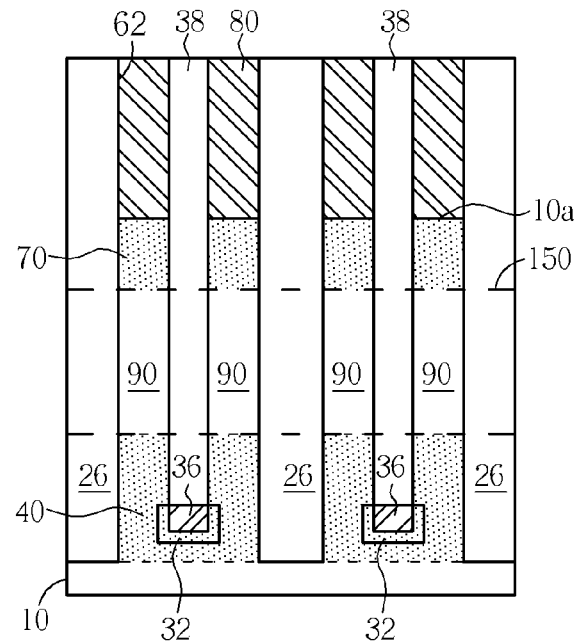

As shown in FIGS. 7A-7C, after the CMP process, the pad nitride layer 14 and the pad oxide layer 12 are removed, thereby forming openings 62 and partially exposing the main surface 10a of the semiconductor substrate 10. A drain implant process is then performed to implant dopants into the exposed main surface 10a of the semiconductor substrate 10 through the openings 62, thereby forming drain doping regions 70 at an upper portion of each of the pillar-shaped sub-regions 101. Alternatively, the pad oxide layer 12 may be removed after the drain implant process. Subsequently, a self-aligned memory process is carried out. A resistive memory material layer is deposited in a blanket manner and fills the openings 62. For example, the resistive memory material layer may be composed of binary transition metal oxides such as HfOx, TiOx, AlOx or the like. A CMP process is then performed to remove the resistive memory material layer outside the openings 62, thereby forming isolated resistive memory elements 80 that are indirect contact with the drain doping regions 70. A top plate common electrode (not shown) may be formed on the resistive memory elements 80 to proved reference voltages.

As shown in FIG. 7C, the memory structure of the present invention features a vertical transistor 201 built in each of the pillar-shaped sub-regions 101. The vertical transistor comprises the source doping region 40, the drain doping region 70, a vertical channel 90 between the source doping region 40 and the drain doping region 70, and a single gate that is part of the word line 54 passing the vertical channel 90.

Figure 8:
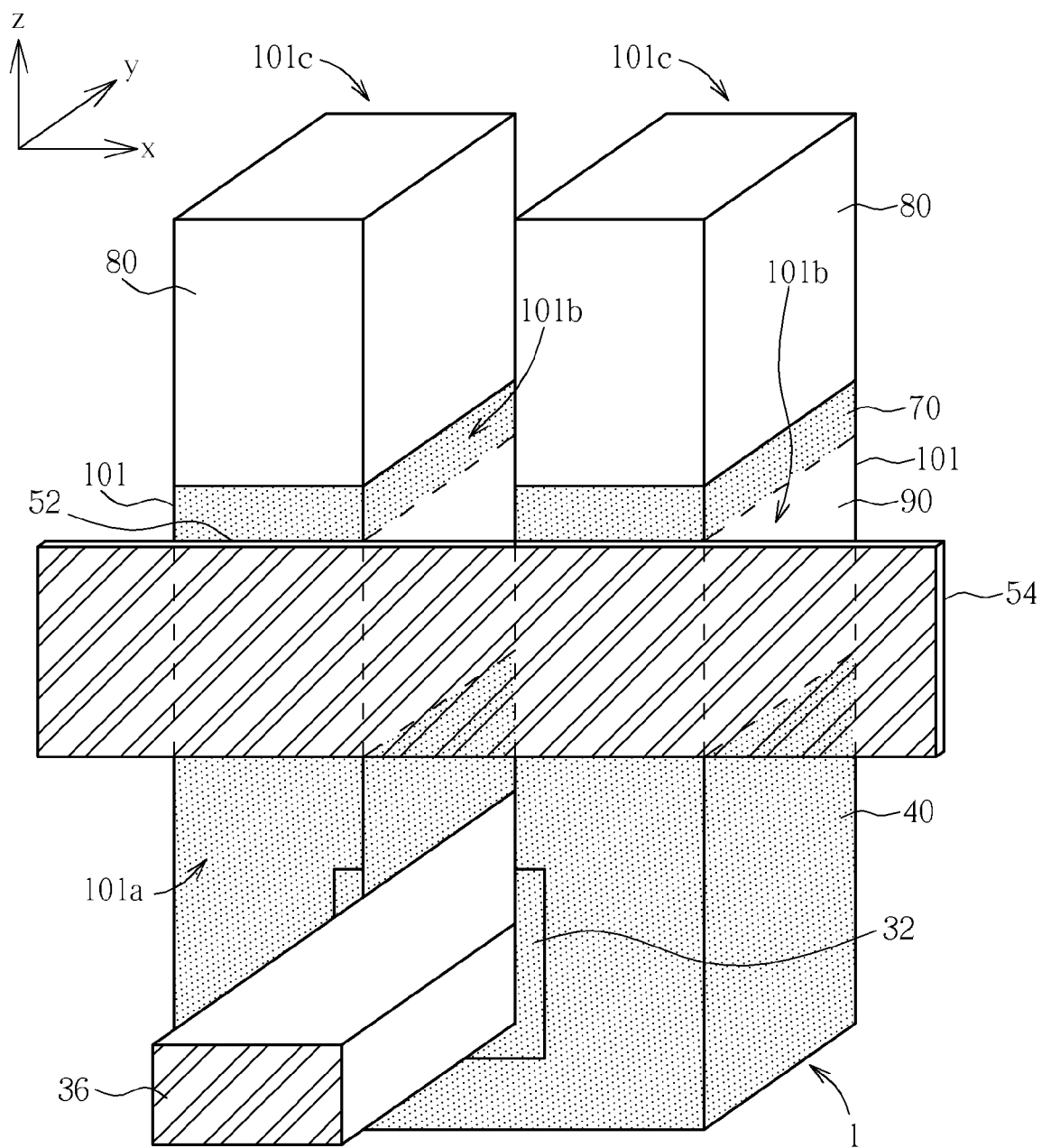
FIG. 8 is a perspective view of a single-gate, 1T-1R RRAM structure according to the embodiment of this invention.

FIG. 8 is a perspective view of a single-gate, 1T-1R RRAM structure according to the embodiment of this invention, wherein like numeral numbers designate like elements or layers. In FIG. 8, for the sake of simplicity, only two adjacent pillar-shaped sub-regions 101 arranged along the reference x-axis are illustrated. Further, the insulating material is omitted. The single-gate, 1T-1R RRAM structure 1 comprises a source doping region 40 at a lower portion of each of the pillar-shaped sub-regions 101, a drain doping region 70 at an upper portion of each of the pillar-shaped sub-regions 101, a resistive memory element 80 located directly atop the drain doping region 70, a vertical channel 90 between the source doping region 40 and the drain doping region 70, a gate oxide layer 52 on a first sidewall 101a of each of the pillar-shaped sub-regions 101, a word line 54 extending along the reference x-axis on the first sidewall 101a, and a bit line 36 buried in the semiconductor substrate 10 and under the word line 54. The vertical channel region 90 and the word line 54 are overlapped. A trench bottom doping region 32 may be provided between the source doping region 40 and the bit line 36. The bit line 36 extending along the reference y-axis on the second sidewall 101b. No word line is formed on the third sidewall 101c that is opposite to the first sidewall 101a.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory structure, comprising:
    an active area of a semiconductor substrate, surrounded by first isolation trenches extending along a first direction and second isolation trenches extending along a second direction;
    a bit line trench recessed into the active area of the semiconductor substrate, wherein the bit line trench extends along the second direction and intersect the first isolation trenches;
    a word line trench recessed into the active area of the semiconductor substrate and being shallower than the bit line trench, wherein the word line trench extends along the first direction and intersect the second isolation trenches, and wherein the bit line trench and the word line trench together divide the active area into four pillar-shaped sub-regions;
    a bit line embedded in the bit line trench;
    a word line embedded in the word line trench;
    a vertical transistor built in each of the pillar-shaped sub-regions; and
    a resistive memory element electrically coupled to the vertical transistor.

2. The memory structure according to claim 1 further comprising a bit line cap oxide layer atop the bit line in the bit line trench for isolating the bit line from the word line.

3. The memory structure according to claim 1 further comprising a word line cap oxide layer capping the word line in the word line trench.

4. The memory structure according to claim 1 wherein the vertical transistor comprises a source doping region at a lower portion of each of the pillar-shaped sub-regions, a drain doping region at an upper portion of each of the pillar-shaped sub-regions, and a single gate that is part of the word line.

5. The memory structure according to claim 1 wherein the bit line comprises TiN.

6. The memory structure according to claim 1 wherein the word line comprises TiN.

7. The memory structure according to claim 1 wherein the resistive memory element comprises binary transition metal oxides.

8. The memory structure according to claim 3 wherein the word line cap oxide layer is substantially flush with the resistive memory element.

9. The memory structure according to claim 4 wherein the vertical transistor further comprises a vertical channel between the source doping region and the drain doping region.

10. The memory structure according to claim 4 wherein a trench bottom doping region is disposed between the source doping region and the bit line.

11. The memory structure according to claim 4 wherein the resistive memory element is in direct contact with the drain doping region.

* * * * *